United States Patent
Bellezza (10) Patent No.: US 10,937,940 B1
(45) Date of Patent: Mar. 2, 2021

(54) CARBON METAL INTERFACES FOR ELECTRICAL CONNECTIONS, ELECTRONIC AND MICRO CIRCUITRY

(71) Applicant: Anthony Paul Bellezza, Parkesburg, PA (US)

(72) Inventor: Anthony Paul Bellezza, Parkesburg, PA (US)

( * ) Notice: Subject to any disclaimer, the term of this patent is extended or adjusted under 35 U.S.C. 154(b) by 0 days.

(21) Appl. No.: 16/259,576

(22) Filed: Jan. 28, 2019

Related U.S. Application Data (63) Continuation-in-part of application No. 16/154,594, filed on Oct. 8, 2018, now abandoned, which is a continuation of application No. 15/608,674, filed on May 30, 2017, now Pat. No. 10,096,761.

(51) Int. Cl.
| | |
|---|---|
| *H01L 35/32* | (2006.01) |
| *H01L 35/08* | (2006.01) |
| *H01L 35/34* | (2006.01) |
| *H01L 35/16* | (2006.01) |

(52) U.S. Cl.
CPC .............. *H01L 35/32* (2013.01); *H01L 35/08* (2013.01); *H01L 35/16* (2013.01); *H01L 35/325* (2013.01); *H01L 35/34* (2013.01)

(58) Field of Classification Search
CPC ....... H01L 35/32; H01L 35/16; H01L 35/325; H01L 35/34
See application file for complete search history.

(56) References Cited

U.S. PATENT DOCUMENTS

| | | | | |
|---|---|---|---|---|
| 10,096,761 | B1 * | 10/2018 | Bellezza | ................. H01L 35/32 |
| 2015/0118411 | A1 * | 4/2015 | Cardenas | ............ C23C 16/0227 |
| | | | | 427/532 |
| 2015/0293065 | A1 * | 10/2015 | Kissell | ..................... C09D 7/61 |
| | | | | 73/865.8 |
| 2016/0064638 | A1 * | 3/2016 | Salvador | ............... H01L 35/325 |
| | | | | 136/230 |
| 2017/0108752 | A1 * | 4/2017 | Milliron | ................ G02F 1/0147 |

\* cited by examiner

*Primary Examiner* — Seahvosh Nikmanesh
(74) *Attorney, Agent, or Firm* — Patent Service Associates; Lyman Smith (57) ABSTRACT

There are two parts to build fusion carbon metal interconnects. First are the fusing metals/alloys, typically in the Martensite phase and lacking carbon. Second are carbonized materials that have carbon infused. These carbonized materials may be referred to as carbon donating materials. Both parts can be interchanged as the substrate or mounted component, or the parts can form linear interface connections. The finished interfaces have very low electrical resistance and/or zero interface electrical resistance. The interconnect circuit topography materials and connections are endless and is dependent on circuit design. One example of such interface is a solderless thermoelectric device capable of use at higher operating temperatures as compared to conventional low temperature solders thus allowing the thermoelectric device to be used in a Seebeck device, for example. The thermoelectric device forms a fusion layer between a copper metal layer and a semiconductor wafer layer to create a true metallurgical bond.

14 Claims, 4 Drawing Sheets

CARBON METAL INTERFACES FOR ELECTRICAL CONNECTIONS, ELECTRONIC AND MICRO CIRCUITRY

CROSS-REFERENCE TO RELATED APPLICATIONS

This application is a continuation-in-part of U.S. patent application Ser. No. 16/154,594, filed Oct. 8, 2018, currently pending, which is a continuation of U.S. patent application Ser. No. 15/608,674, filed May 30, 2017, now U.S. Pat. No. 10,096,761, issued on Oct. 9, 2018.

BACKGROUND OF THE INVENTION

1. Field of the Invention

One or more embodiments of the invention relates generally to carbon metal interfaces. More particularly, the invention relates to solderless thermoelectric interfaces that provide a true metallurgical bond of the device layers with superconducting interfaces and proper thermoelectric properties that are needed for electrical generation devices Seebeck devices) and cooling devices (Peltier devices), for example.

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

The performance and reliability of thermoelectric devices is critical when serving the power, refrigeration and emerging semiconductor markets.

A nickel "diffusion barrier" coating, in combination of a variety of solders, is currently used to join the layers of thermoelectric devices. Electroplated and Electro-less nickels fail to protect the semiconductors from contamination due to micro-cracking in thermoelectric refrigeration devices and delamination in thermoelectric generators. Solders fail to withstand high currents, melt under high temperatures, crack and delaminate under the mechanical stress of low temperatures, fail to support superconductivity and produce high electrical resistivity.

As can be seen, there is a need for a fused junction that supports superconductivity and blocks further migration of metals into the thermoelectric semiconductor. These junctions should exhibit mechanical tenacity under operating extremes of high electrical current and high and low temperatures.

SUMMARY OF THE INVENTION

Embodiments of the present invention provide a solderless thermoelectric device can has applications in Peltier and Seebeck devices, for example. As compared to low temperature solders currently used in the art, the bond between layers in the thermoelectric devices of the present invention can withstand higher operating temperatures. Moreover, the fusion methods as described herein do not contaminate the solder metals into the semiconductor, as may be the case in conventional methods.

The thermoelectric devices of the present invention are fused together by a true metallurgical bond of the device layers to provide a superconducting interface and the proper thermoelectric properties needed for Seebeck and Peltier devices.

By impregnating graphene into the semiconductors, oxidation of the semiconductor can be prevented. Graphene acts as a metal diffusion barrier and is a significant improvement over nickel diffusion barriers currently used in the art. In addition, graphene has the ability to self-repair its superconducting web structure and can withstand many thermo cycles during the life operation of Seebeck and Peltier devices, for example. Graphene can be used in a carbonization of martensitic to austenitic structure when impregnated into semiconductors of thermoelectric devices.

Any and all metals that phase change from martensitic to austenitic while being heat treated can be used to carbon bond the semiconductors to the phase change metal or material. An electroplated nickel/iron metal is used in the examples discussed herein.

An ideal substrate material is one with low electrical resistance and a good conductor of heat. Copper is used as a substrate material in the examples discussed herein.

Generally, embodiments of the present invention solve the problem of carrying high electrical currents through a series of interfaces of a thermoelectric device at high and low temperatures with minimal electrical resistance. Embodiments of the present invention also maintain the electrical performance of the thermoelectric semiconductor by impregnating graphene carbon molecules, which bond with the crystalline structure of the thermoelectric semiconductor, which also acts as a diffusion barrier, protecting the thermoelectric semiconductor from metal contamination and providing a junction that will withstand stresses caused by mechanical bending as well as high temperature gradients.

Embodiment of the present invention provides additional unique features required by high temperature thermoelectric generators.

It is a further objective of the present invention to provide a solder-less thermoelectric device for both Seebeck applications and Peltier applications.

It is a further objective of the present invention to use true metallurgical fusion of thermoelectric interfaces that do not require solders that interfere with the thermoelectric effects by creating layers of metal between the intended contact of P-Type and N-Type thermoelectric interfaces.

It is a further objective of the present invention to solve the limitations of both Peltier and Seebeck devices and allow continuous use of operating devices for many years.

It is a further objective of the present invention to utilize carbon structures as diffusion barriers that prevent the migration of metals into each other, and also prevent the contamination of the materials in thermoelectric semiconductor devices.

It is a further objective of the present invention to utilize carbon to protect against oxidation of the metals in the thermoelectric semiconductor devices The formation of fusion interfaces between the graphene carbon and a metal component is the major breakthrough of the present invention. The metal—graphene carbon fusion requires the metal component to want carbon in its crystalline lattice. This condition exists when a metal that is in the allotropic martensitic state is transformed to the austenitic state. One such metal is class 300 Stainless Steel, for example. This metal can be brought into juxtaposition with the graphene impregnated thermoelectric semiconductor and subsequently transformed from martensitic steel to austenitic steel forming the aforementioned fusion with the carbon that is present after heating. The resulting fusion layer fulfills the requirements fur fusing a metal conductor to an active thermoelectric semiconductor with an extremely strong fusion weld without interfering with the thermoelectric semiconductor electrically and providing a temperature and current tolerant superconducting interface. The process can also be improved by drawing the graphene oxide solution into the grain structure of the thermoelectric semiconductor by application of a vacuum before transformation reduction into graphene carbon.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention, and is not intended to limit the invention to the specific embodiments illustrated by the figures or description below.

As is well known to those skilled in the art, many careful considerations and compromises typically must be made when designing for the optimal configuration of a commercial implementation of any system, and in particular, the embodiments of the present invention, A commercial implementation in accordance with the spirit and teachings of the present invention may be configured according to the needs of the particular application, whereby any aspect(s), feature (s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

There are two parts to build fusion carbon metal interconnects. First are the fusing metals/alloys, typically in the Martensite phase and typically lacking carbon. Second are carbonized materials that have carbon infused. These carbonized materials may be referred to as carbon donating materials. Both parts can be interchanged as the substrate or mounted component, or the parts can form linear interface connections. The finished interfaces, formed as described below, have very low electrical resistance and/or zero interface electrical resistance. The interconnect circuit topography materials and connections are endless and is dependent on circuit design.

Various substrates or component materials can be carbon infused. These materials include carbon, carbon nano-ribbon, graphene, carbon nano tubes, and carbon impregnated metals, ceramics, polymers, sintered metal, powdered metals, alloys, and composites. The materials can be carbonized in any number of processes including grain boundary impregnation, arc plasma deposition, thereto coating processes, electroplating deposition, hydrostatic pressure and/or vacuum impregnation soaking in graphene oxide in deionized (DI) water and reduced to graphene by exposing to electromagnetic radiation and/or any metallurgical process that can either coat or impregnate the materials, including carbon gas impregnation under a vacuum or pressure atmosphere. Also, any and all materials that can be processed to be a carbon donator when interfaced with a phase changing material or metal in the Martensite form can be used.

The carbon absorbing material can be various materials as well. Such materials include carbon absorbing phase change metals in the Martensite to Austenite phase transition by heating under mechanical pressure. Heating can be done by a furnace, laser welding, laser sintering, sono welding, chemical or any other way known in the art. While the description herein may refer to "phase change materials", it is further understood that this term refers to any material that can absorb carbon and produce a fusion connection with a carbon donating material can be made to work in embodiments of the present invention.

Linear interconnects may be formed from various materials. For example, carbon nano ribbon, graphene, carbon nano tubes and carbon can be joined by heating over lapping carbon materials that have a phase change material sandwiched between connecting layers. The phase change material is in the Martensite form and can be foil, powdered metals, micro screen, metal compounds that have been reduced to metals and made to be in the Martensite phase. These connecting layers/components can be made by laser sintering printing, electro plating and any way known in the art.

Processes according to embodiments of the present invention can describe methods for making carbon metal interconnects with very low or zero electrical resistance. There are many combinations of substrate and components that can be used in processes to build interfaces and linear connections according to embodiments of the present invention. But there are only two basic material properties that need to be formulated to build fusion interfaces. The first basic material is a metal or metal alloy that can phase change from Martensite to Austenite while being heated. This may be referred to as the metal absorbing member or material of the interface. The metal absorbing material can also be any phase changing material that absorbs carbon.

The second material for building fusion interfaces is a carbon or carbonized member of the interface. This member may be referred to as the carbon donator.

The carbon donating and metal absorbing properties of the material form the interface that can be made in many different metallurgical processes that is known in the art, from melting and alloying to deposition done by plasma, electrical, arc, impregnation, mixing, wash coating, sintering, printing circuits, micro electronics, chemically, metal compound reduction, annealing and cryogenic treating for phase changing preparation to the Martensite form.

The advantages of this fusion processes are to minimize the use of solders that may contaminate other electrical components by ion metal diffusions and also environmental contamination. The use of graphene in electronics, as described in the example below, referring to the Figures, is a very good metal diffusion barrier known and is superconducting. The interface process of embodiments of the present invention forms a true metallurgical fusion of the interfaced components and allows for low or zero electrical resistance of components of carbon for micro electronics and the new quantum circuits in computers.

One step in creating fusion interfaces is to custom design the process to the best method of forming the connections with the end results clearly in focus, and by selecting a phase change metal or metal alloy that is in the Martensite form ready to absorb carbon from the donator. These metals include iron, iron nickel, stainless steel 300 series, or any metal or material that can absorb carbon and he adapted into a process. The form of the phase change materials can be bulk metal, thin film, powdered metal and powered metal alloys, sintered, electroplated or any other form known in the art. The phase change carbon absorbing material or the metals should be in the ready Martensite form. This can be accomplished, for example, by submerging into liquid nitrogen for 1-24 hours. This cryogenic step changes Austenite phase materials to the Martensite form, ready to absorb carbon.

The carbon donator could be any material that can be impregnated with carbon by alloying, mixing, coating, thermo plasma arc, electroplating, soaking and bushing or any method known in the art. One process, as described in the example below, would be to use graphene oxide to penetrate the grain boundaries using hydrostatic pressure and/or vacuum impregnation, soaking in graphene oxide liquid followed by reducing the graphene oxide by, for example, electromagnetic radiation using any method such as microwaves and/or UV light. If the graphene oxide is deeply embedded into a metal, it may need an electromagnetic spectrum that can penetrate areas thru the thickness of the material, creating graphene from graphene oxide. This additional treatment may be useful, for example, when using porosic sintered metals, sintered copper or similar material with high porosity. Also, other processes can be used, including carbon gas impregnation under vacuum or pressure atmospheres.

In preparing the metallic side of the interface/connector, it is important to be sure the metal, metal alloy or material is in the carbon absorbing phase state. This may be done, for example, with metals, by cleaning then cryogenic treatment by, for example, submerging in liquid nitrogen for 1-24 hours, followed by allowing the metal to gradually return back to room temperature. in this procedure, the metal may be phase changed to the Martensite form and ready to absorb carbon from the carbon donating member of the interface upon heating under mechanical pressure. This cryogenic treatment can be done on bulk metals, metal alloys, sintered metals, powdered metals and may be done after high temperature printer laser sintered deposits for circuits and/or any connecting design topography and methods of metal depositing prior to the fusion step.

The carbon donating material may be any material that is carbon or carbon based composite that donates carbon upon corning in contact with a carbon absorbing metal or material can be used in embodiments of the present invention to make fusion connections. The carbon donating material can be proceeded to contain carbon that can be later donated to a carbon absorbing metal or material.

The process of fusion connections according to embodiments of the present invention can be used for electrical connections as well as for connections other than electrical connections. For example, the fusion connections could be used in place of manufacturing processes that use solders, brazing and welding parts together. The simplicity of the processes according to embodiments of the present invention may be less expensive and easier that other conventional methods for joining and assembling parts.

The preparation of the carbon absorbing carbon donating parts according to embodiments of the present invention should follow good metallurgical procedures and may be dependent of which materials are used. Examples of some of these processes for the carbon absorbing member of the connection include being sure the metal material is in the form for absorbing carbon from the donating member of the connection. In the case of carbon absorbing metals, this means that they should be in the Martensite phase. Cryogenic treatment in liquid nitrogen is a procedure typically used for assuring the metals are in the Martensite phase. If electroplating or other metal deposition processes are used, the metal should be annealed in a furnace in an inert or reducing atmosphere and, if needed, cryogenic treatments.

The process used in preparing the fusion members of the interface may be determined by the design of the device and if the fusion members are carbon absorbing or carbon donating during the fusion step. It is important when selecting a fusion process for semiconductors that contamination be kept as low as possible to prevent failure of the circuit when building electronic and micro circuits. Each application of the invention may incorporate custom design considerations of the process and the materials being used but is based on two technical scientific principles—one of a carbon absorbing material and one of a carbon donating material during the fusion process.

A specific application of the present invention is described below, where a thermoelectric device is formed using the fusion connections according to embodiments of the present invention.

Figure 1:
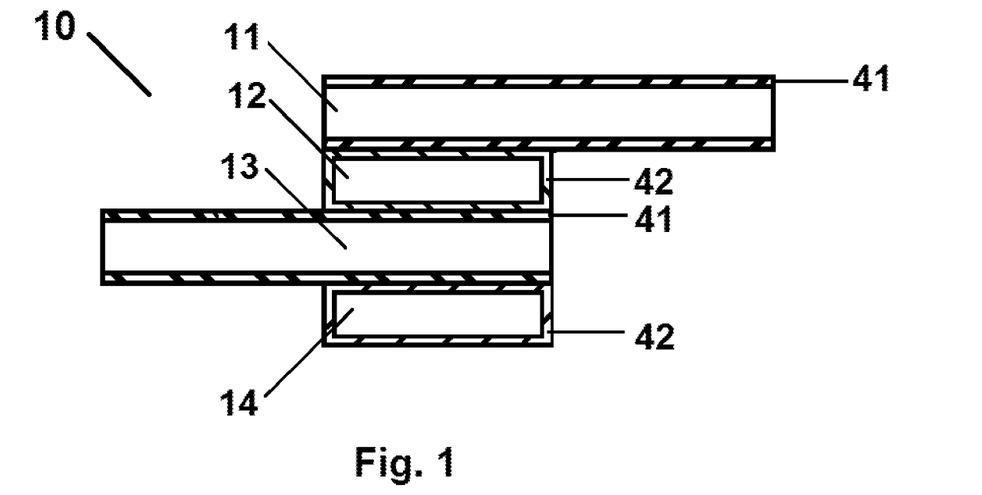
FIG. 1 is a cross-sectional.view of a layered structure according to an exemplary embodiment of the present invention.
Figure 2:
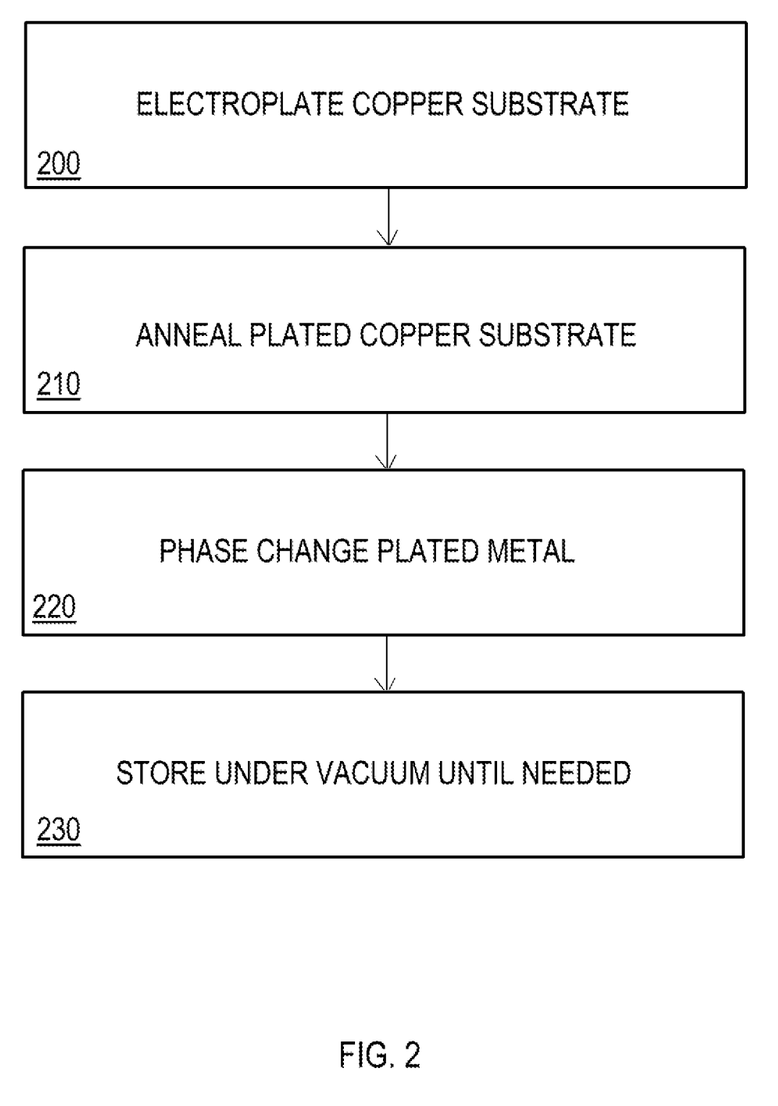
FIG. 2 is a block diagram illustrating the formation of copper paddles according to an exemplary embodiment of the present invention.

Referring now to FIGS. 1 and 2, copper paddles can be prepared. Copper is typically used as the substrate for the hot and cold paddles because of its high conductivity and low electrical resistance, typically on the order of $1\times10^{-7}$ to $1\times10^{-8}$, for example. It should be noted that copper is usually a contaminate of bismuth-tellurium semiconductors.

According to an embodiment of the present invention, a copper substrate 11, 13 can be cleaned and prepared for electroplating. Various metals can be used for electroplating onto the copper substrate. In this embodiment, in step 200, a nickel/iron (40/60) solution can be used in an electroplating tank to form an electroplating 41 onto the copper substrate 11, 13. It should be noted that nickel and iron is not a contaminate of bismuth-tellurium semiconductors.

Typically, the electroplating can take place for about 3 minutes and, when complete, the electroplated copper substrate can be removed from the tank, rinsed and dried.

The nickel iron content in the plating bath may vary according to application. In some embodiments, a 40% nickel/60% iron alloy may be used. In some embodiments, the maximum nickel content may be about 40% as the nickel/iron alloy may be used to prevent oxidation of the iron in the interface if occurring before and after fusion of the interface. Typically, it is desirable to use the lowest nickel content in any of the processes because the fusion occurs with the iron that is in the alloy and not the nickel, for the most part. Often, it is desirable to use the lowest nickel content possible to still prevent oxidation of the interface after fusion and in operation of the units. If there is no concern of oxidation before or after the fusion process, then iron alone could work, either electroplated or in powder form where needed. If only iron is used, the parts should be protected from oxidation after the cryogenic treatment until the fusion assembly is completed. In some embodiment, the graphene that is fused to the iron in the interface could protect the iron in the now fused joint, as the graphene may protect the iron from oxidation/diffusion.

In step 210, the electroplated copper is annealed to bond the electroplated metal to the copper substrate. In some embodiments, the electroplated copper can be put in a quartz lined tube furnace and annealed for 3 hours at 600 C in a hydrogen atmosphere. The furnace is then allowed to cool to room temperature while under a hydrogen or argon atmosphere.

Depending on the specific material, Martensite phase material may start to transform to Austenite at approximately 230 C and above. Typically, below 230 C there is no transformation occurring. Above 230 C, the transformation speed may be determined by time and temperature. A lower temperature may be suitable for use in surface mounting of circuit board components as well as any heat sink components in electronic/electrical applications. Micro electronic circuits can be processed with the use of precision laser and sonic micro heating. The lower transformation temperature can replace solders that are used at the same temperatures but giving a low electrical resistance fusion joining. The benefit of the fusion process of the present invention over low temperature solders is what occurs with solder components that reach re-melt temperatures in over heated electronic circuits. By using the fusion process of the present invention, the joint can become stronger if the electronic circuit becomes over heated because the Martensite remaining would continue to transform to Austenite, strengthening the fusion joint.

The electroplated copper is removed from the room temperature furnace and immediately put into liquid nitrogen, typically for about 6 hours, to change the electroplated metal (in this case, the electroplated nickel/iron) from austenitic phase to the martensitic phase in step 220. Finally, in step 230, the electroplated copper is stored under vacuum, such as in vacuum bags, until assembly.

The transformation from Austenitic to Martensite phase may occur instantly at cryogenic temperatures. This feature may also be good for circuit board processing, where automation assembly time is limited. Using micro cryosurgery, dermatology type devices can be used for production of circuit boards or micro repairs. Also, the annealing step after electro plating of the iron alloy on the substrate can be combined in one step during the fusion heating process if desired.

Figure 3:
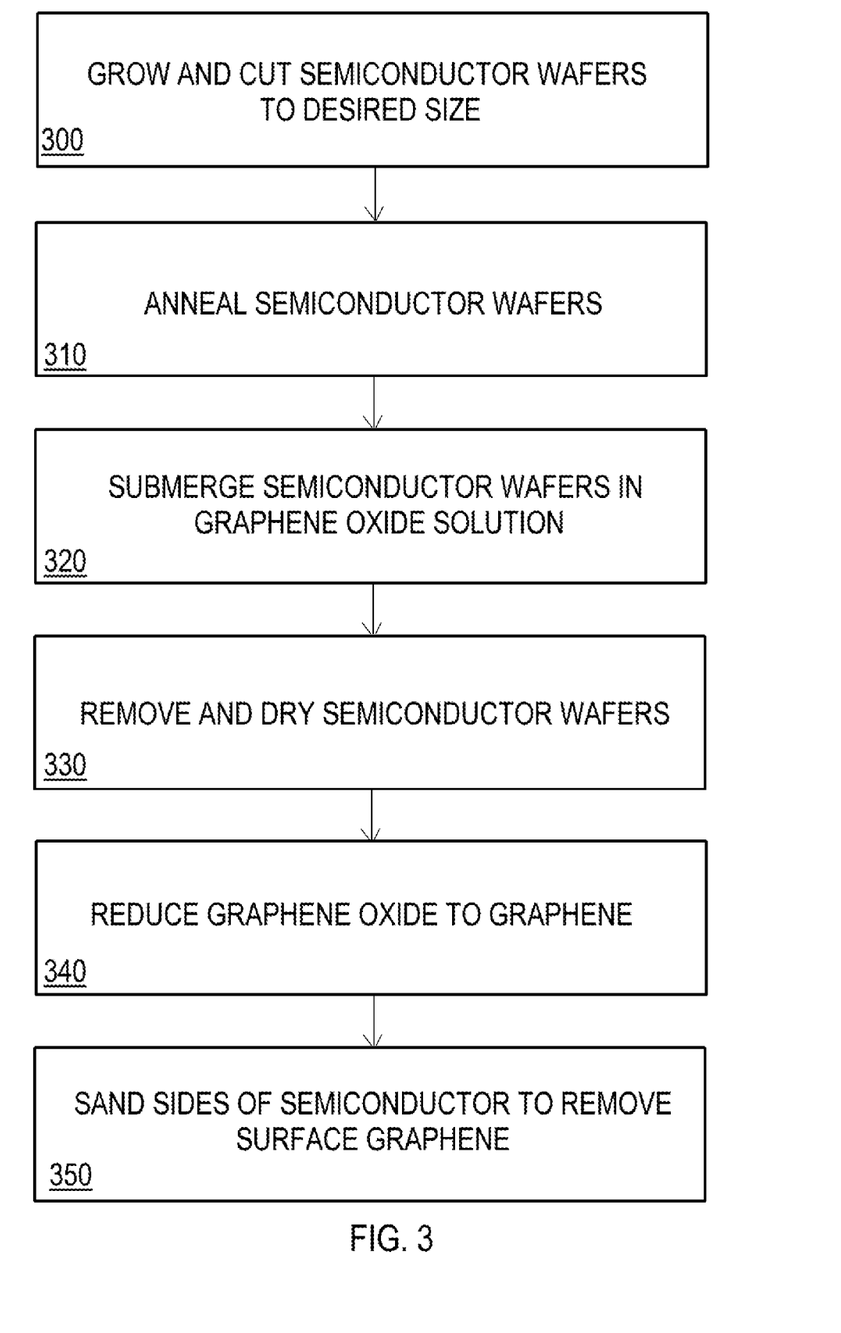
FIG. 3 is a block diagram illustrating the formation of graphene coated semiconductor wafers according to an exemplary embodiment of the present invention.

Referring to FIGS. 1 and 3, thermoelectric semiconductor wafers 12, 14 can be, for example, bismuth-tellurium semiconductors. The thermoelectric semiconductor wafers 12, 14 (also referred to as semiconductors 12, 14 or wafers 12, 14) can be made by various methods, such as the Bridgeman method of crystal growing. Once grown, in step 300, the semiconductor wafers 12, 14 can be cut to the desired size.

In step 310, the semiconductor wafers can be annealed, such as in a hydrogen gas quartz tube at 300-400 C for 3 hours. The annealed wafers are allowed to cool under hydrogen or argon atmosphere to room temperature.

The semiconductor wafers are removed from the annealing furnace and immediately submerged in a solution of distilled water and graphene oxide, in step 320. The graphene oxide may be present at a concentration of 0.01% for example. The solution with the wafers may be placed under a slight vacuum below the vapor pressure of the solution and or may be placed in a high pressure chamber for 5 hours. This vacuum or pressure can help impregnate the wafer grain boundaries and surface with graphene oxide.

The wafers are then removed from the solution and dried, in step 330, in a chamber of argon at about 50 C for 2 hours. In step 340, the semiconductor wafers are then removed from the drying chamber and are treated with a reducing agent, such as electromagnetic radiation for 15 seconds, to reduce the graphene oxide to graphene.

It should be understood that, after treating the semiconductor with graphene oxide and reducing it to graphene, the semiconductor fracture/brake properties become much stronger as compared to the original wafer. This can be very beneficial to working with bismuth/tellurium thermoelectric wafers because the untreated wafers are very fragile and brake quickly upon uneven pressure.

In step 350, the semiconductor wafers are lightly sanded on their four sides to remove surface graphene, leaving surface graphene 42 on the two flat interface surfaces. The semiconductor waters 12, 14 are now ready for assembly.

Figure 4:
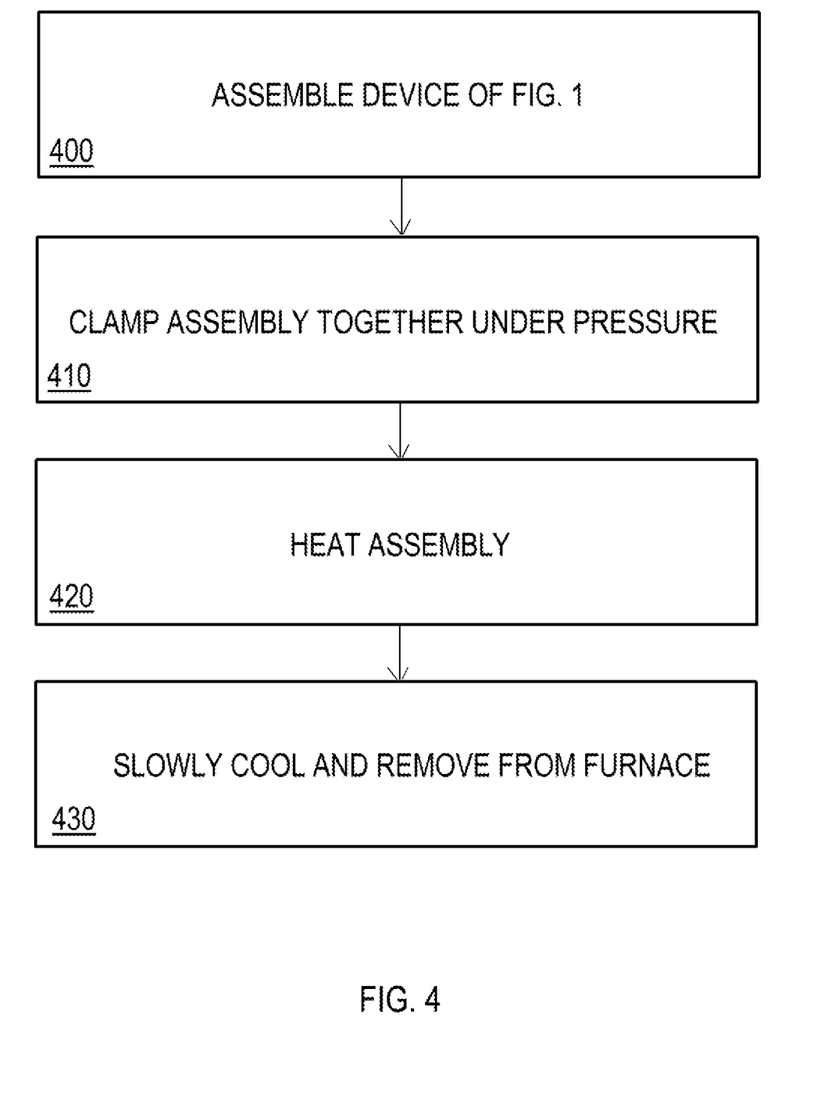
FIG. 4 is a block diagram illustrating the formation of a thermoelectric device assembly according to an exemplary embodiment of the present invention.

Referring now to FIGS. 1 and 4, a thermoelectric device assembly 10 can be assembled as described herein. In step 400, the first copper electroplated nickel/iron plated substrate 11 can be layered with a first p-type semiconductor wafer 12, then another copper substrate 13 and then an n-type semiconductor wafer 14. This makes up one full element of a thermoelectric Seebeck or Peltier device, for example.

In step 410, the thermoelectric device assembly 10 can be clamped together under high pressure with the use of a clamp or a cryogenic treat shape memory alloy that applies pressure in the heating fusion step of the assembly, described below. The clamp or shape memory allow can be insulated from the elements by, for example, a high temperature mica inserted between the clamp and/or shape memory alloy. While FIG. 1 shows a particular cross-section, the device assembly 10 can be made up of many elements and could be in any shape or configuration, such as linear or circular.

In step 420, the entire assembly 10 can be put into a quartz furnace and heated to below the melting temperature of the bismuth-tellurium semiconductors (440-500 C) and held at this temperature for 3-10 hours, with the exact time being determined by trial and error and the desired fusion bond. In step 430, the assembly is then slowly cooled to room temperature and removed from the furnace.

While being heated, the shape memory alloy can shrink, applying pressure to the entire assembly, for example. The fusion bonding takes place in what is known in the heat treating industry as the carbonization of the martensitic to austenitic phase change as the metal absorbs the carbon impregnated semiconductor.

What is normally considered a cold junction of the interfaces of the semiconductor with the copper substrate is now a fusion bond of the semiconductor, nickel/iron and copper. This fusion bond is required for operating a Seebeck thermoelectric device, for example.

The semiconductor junctions formed by the methods of the present invention now super conduct into the copper and the total resistance of the device has the resistance of copper with no loss due to the junctions. In other words, the device total resistance is that of one piece of copper.

The use of conventional low temperature solders is suitable for Peltier devices, but fall far short of operation in high temperature devices because the low temperature solders of today are not considered fusion bonded, but are, in fact, metallic glues that have good electrical conduction suitable for Peltier devices, but no fusion bonding requirement that is needed for good bimetal thermoelectric Seebeck devices.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. A method for forming an interface, comprising:
providing a carbon absorbing material operable to receive carbon from a carbon donating material;
contacting the carbon donating material with the carbon absorbing material;
applying a pressure to an assembly of the carbon absorbing material and the carbon donating material; and
heating the assembly to a temperature below a melting point of each of the carbon absorbing material and the carbon donating material to cause a fusion bond to form from carbonization of the carbon absorbing material.

2. The method of claim 1, wherein the carbon absorbing material is a metal or a metal alloy in the Austenitic phase.

3. The method of claim 2 wherein the carbon absorbing material contacts the carbon donating material while in the Martensitic phase, wherein the heating step converts the carbon absorbing material from the Martensitic phase to the Austenitic phase.

4. The method of claim 3, wherein the carbon absorbing material forms the fusion bond while undergoing the Martensitic phase to the Austenitic phase change.

5. The method of claim 1, wherein the heating step is performed in an inert atmosphere.

6. The method of claim 1, wherein the carbon accepting materials are selected from the group consisting of a copper substrate, an iron substrate, and an iron/nickel substrate.

7. The method of claim 1, further comprising cooling the carbon absorbing material to change the carbon absorbing material to the Martensitic phase.

8. The method of claim 1, wherein the carbon donating material is selected from the group consisting of carbon, carbon nano-ribbon, graphene, carbon nano-tubes, and carbon impregnated metals, ceramics, polymers, sintered metal, powdered metals, alloys, and composites.

9. A method for making a carbon metal interconnect comprising: contacting a carbon donating material with a carbon absorbing material under at least one of temperature and pressure to create a fusion bond therebetween to form the carbon metal interconnect.

10. The method of claim 9, wherein the carbon absorbing material is a metal or metal alloy that can phase change from Martensite to Austenite while being heated.

11. The method of claim 9, wherein the carbon donating material is a carbon or carbonized member.

12. The method of claim 9, wherein the fusion bond forms while the carbon absorbing material undergoes a phase change from a Martensitic phase to an Austenitic phase.

13. The method of claim 9, wherein the carbon donating material is a semiconductor impregnated with graphene.

14. The method of claim 13, wherein the semiconductor impregnated with graphene has a breakage strength greater than the semiconductor alone.

\* \* \* \* \*